(12) United States Patent
Harvilchuck et al.

(10) Patent No.: US 8,234,780 B2
(45) Date of Patent: Aug. 7, 2012

(54) SUBSTRATE CARRIER SYSTEM (75) Inventors: Laurence A. Harvilchuck, Brackney, PA (US); George R. Westby, Owego, NY (US)

(73) Assignee: Universal Instruments Corporation, Binghamton, NY (US)

( * ) Notice: Subject to any disclaimer, the term of this patent is extended or adjusted under 35 U.S.C. 154(b) by 1032 days.

(21) Appl. No.: 12/038,338

(22) Filed: Feb. 27, 2008

(65) Prior Publication Data

US 2009/0214323 A1    Aug. 27, 2009

(51) Int. Cl.
*H05K 3/30* (2006.01)

(52) U.S. Cl. ........... 29/832; 29/830; 29/757; 29/759; 29/760; 269/47; 269/287; 414/589

(58) Field of Classification Search ........... 29/830, 29/832, 757, 759, 760; 269/47, 287; 414/589
See application file for complete search history.

(56) References Cited

U.S. PATENT DOCUMENTS

| | | | |
|---|---|---|---|
| 4,684,113 A * | 8/1987 | Douglas et al. | 269/21 |
| 4,759,488 A | 7/1988 | Robinson et al. | |
| 5,044,615 A | 9/1991 | Newman et al. | |
| 5,456,402 A | 10/1995 | Curtin | |
| 5,501,436 A * | 3/1996 | Miller | 269/47 |
| 5,667,128 A | 9/1997 | Rohde et al. | |
| 5,785,307 A | 7/1998 | Chung | |
| 5,891,295 A | 4/1999 | Barringer et al. | |
| 5,984,293 A * | 11/1999 | Abrahamson et al. | 269/266 |
| 6,164,636 A * | 12/2000 | Taylor | 269/287 |
| 6,267,288 B1 | 7/2001 | Chung | |
| 6,293,534 B1 * | 9/2001 | Leban | 269/309 |
| 6,364,194 B1 | 4/2002 | Ciniglio | |
| 6,378,857 B1 * | 4/2002 | Taylor | 269/47 |
| 6,511,574 B2 * | 1/2003 | Barringer et al. | 156/295 |
| 6,518,665 B1 * | 2/2003 | Westby et al. | 257/738 |
| 6,655,535 B2 * | 12/2003 | Wark et al. | 211/41.17 |
| 6,695,921 B2 | 2/2004 | Cheng et al. | |
| 6,775,904 B1 * | 8/2004 | Duebel | 29/760 |
| 6,799,714 B2 | 10/2004 | Gleason | |
| 7,028,391 B2 | 4/2006 | Pham-Van-Diep et al. | |
| 7,107,672 B2 * | 9/2006 | Onitsuka et al. | 29/832 |
| D543,333 S | 5/2007 | Kojima | |
| 7,229,000 B2 | 6/2007 | Wang et al. | |
| 7,306,092 B1 | 12/2007 | Heinzl et al. | |
| 7,311,302 B1 * | 12/2007 | Farlow et al. | 269/296 |
| 7,367,252 B2 * | 5/2008 | Tripard | 83/467.1 |
| 2005/0230050 A1 | 10/2005 | Nogiwa et al. | |
| 2005/0242341 A1 * | 11/2005 | Knudson et al. | 257/40 |
| 2007/0157668 A1 * | 7/2007 | Nadaud et al. | 65/60.1 |
| 2007/0273019 A1 * | 11/2007 | Huang et al. | 257/690 |
| 2009/0146355 A1 * | 6/2009 | Harvilchuck et al. | 269/91 |

FOREIGN PATENT DOCUMENTS

| | | |
|---|---|---|
| FR | 2779079 | 12/1999 |
| JP | 2002232197 | 8/2002 |
| JP | 2006066524 | 3/2006 |

* cited by examiner

*Primary Examiner* — Derris Banks
*Assistant Examiner* — Azm Parvez
(74) *Attorney, Agent, or Firm* — Schmeiser, Olsen & Watts, LLP

(57) ABSTRACT

A substrate carrier system is provided for physical management of substrate(s) during a variety of assembly techniques performed on the both sides of the substrate(s) without dismounting or changing carrier systems.

7 Claims, 8 Drawing Sheets

SUBSTRATE CARRIER SYSTEM

BACKGROUND OF THE INVENTION

1. Technical Field

This invention relates generally to physical management of substrates. More particularly, the present invention relates to an apparatus for simplified fixturing, tensioning, and ancillary processing of substrates for fabrication and assembly of surface mount products.

2. Related Art

Flexible and rigid substrates are utilized in many different applications, and it is often necessary to physically manage how these substrates are handled during various process steps, including, but not limited to: screening, printing or stenciling, material dispensing, component placement, soldering, and electrical testing (the various processing steps hereinafter referred to as "assembly techniques"). To accomplish various assembly techniques, the substrate(s) may be placed into a substrate carrier system. This carrier system typically comprises a frame to which the substrate may be mounted and a means to register and/or accommodate variations in the dimensions peculiar to individual substrates once mounted to the frame. One common substrate carrier system utilizes the application of external forces in conjunction with a split frame to facilitate operable substrate handling during various assembly techniques; however, it is then necessary to use additional appliances to both maintain the external forces on the substrate and apply tension on the split frame. Another carrier system comprises a frame with tooling pins and spring tensioning to stretch the substrate. However, each such carrier system must be customized, as the tooling pins and spring tensioners are set for a fixed configuration of tooling holes in a particular substrate. Yet another common substrate carrier system involves mounting the substrate material to a frame that exhibits an equal or higher coefficient of thermal expansion ("CTE") to that of the substrate material. Thus, when heated within a limited processing temperature range, the frame material expands faster than the substrate and the substrate becomes tensioned. Yet, this thermally relative substrate carrier system often requires exotic frame materials, which can be expensive. In addition, an excessive mismatch of the CTE of the substrate material to the CTE of the frame material may also lead to breakage or distortion of the substrate or require an unreasonably limited processing temperature range. Still another known substrate carrier system involves laminating the substrate material onto a rigid frame for performing the requisite assembly techniques. This more permanent handling method, however, may limit the post-processing options because of the frame material thickness in direct overlap with the substrate that is necessary to maintain the mechanical integrity of the laminated assembly.

None of the known carrier systems described above have the ability to simultaneously tension the substrate and permit unencumbered processing of both top side and bottom side surfaces of the substrate without changing or adjusting the carrier system, or having some sort of other operator intervention. Often times the frame of a typical carrier system supports the edges of the substrate as well, thereby limiting the ability to process these same edges of the substrate. In addition, standard carrier systems are also often thick, thereby creating a hindrance to various assembly techniques, especially screening and printing.

Therefore, there exists a need for an apparatus for reliably tensioning flexible and rigid substrate to remove undesirable defects, such as wrinkles or other non-planar conditions that may be introduced as a result of fabrication, mounting, or during assembly techniques as well as provide the ability to process both sides of the substrate without operator intervention or alteration or process interrupting changing of the apparatus itself. The presently disclosed improvement allows for simplified fixturing, tensioning, and ancillary processing of flexible and rigid substrates for patterning, printing, placement, reflow, deposition, or any other processing step for both sides of the substrate.

SUMMARY OF THE INVENTION

The present invention provides an apparatus and method to aid in fixturing, tensioning, and ancillary processing of substrates for fabrication and assembly of surface mount products.

A first aspect of the present invention provides a substrate carrier system for a substrate for use with a plurality of assembly techniques, comprising: a frame; and at least two suspension arms for holding the substrate, wherein, the suspension arms allow the substrate to be vertically translated relative to the frame.

A second aspect of the present invention provides a substrate carrier system for a substrate for use with a plurality of assembly techniques, comprising: a disposable frame having an outer edge, wherein the outer edge is structurally manipulated to strengthen the frame; and at least one land element onto which the substrate is mounted.

A third aspect of the present invention provides a method of supporting a substrate during an assembly process, the method comprising: providing a substrate carrier system including: a frame having an outer edge, wherein the outer edge is structurally manipulated to strengthen the frame; and at least two suspension arms for holding the substrate, wherein the suspension arms allow the substrate to be vertically translated relative to the frame; mounting the substrate to the carrier system; and performing an assembly process on the substrate while the substrate is mounted to the carrier system.

BRIEF DESCRIPTION OF THE DRAWINGS

Some embodiments of this invention will be described in detail, with reference to the following figures, wherein like designations denote like members, wherein.

DETAILED DESCRIPTION OF THE INVENTION

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. and are disclosed simply as an example of an embodiment. The features and advantages of the present invention are illustrated in detail in the accompanying drawings, wherein like reference numerals refer to like elements throughout the drawings.

As a preface to the detailed description, it should be noted that, as used in this specification and the appended claims, the singular forms "a", "an" and "the" include plural referents, unless the context clearly dictates otherwise.

Flexible and rigid substrates serve as a base material on which an assembly technique may be conducted or onto which other materials may be added. For example as shown in FIGS. 1A-1D, the substrate 100 may be a catalytic material upon which various chemical species may react and/or may be a base material that features may be printed onto. For example, features such as lands 112A, 112B may be printed on to the substrate 100. Often a substrate 100 may comprise a material upon which conductive or semiconductive devices are fabricated and/or electrical components 110A, 110B are assembled onto. Accordingly the substrate 100 may be known as a base film, a flexible wafer, or a flexible or rigid printed circuit board (PCB). In addition substrate 100 may include registration holes 114, which holes 114 may help properly locate a substrate 100 for application of various assembly techniques.

During various assembly techniques, a substrate embodiment, such as substrate 100 may be mounted to a substrate carrier system. Embodiments of a carrier system may include one or more suction areas, means to register the carrier system, and means to strengthen the outer edges of the carrier system, as well as a plurality of arms. The suction areas may be used to provide a portion of the carrier system onto which a vacuum suction nozzle could be placed such that the carrier system maybe picked up and possibly moved during one or more assembly techniques. Moreover, the registration means may be used to locate the carrier system during one or more assembly techniques. Additionally, the strengthening of outer edges may provide a more robust carrier system, such that the assembly techniques may be carried out in a reliable manner. The carrier system arms may be used, inter alia, to mount the substrate, and when used with an assembly technique which provides a support system, may help allow the substrate to be tensioned and/or vertically translated.

Figure 1A:
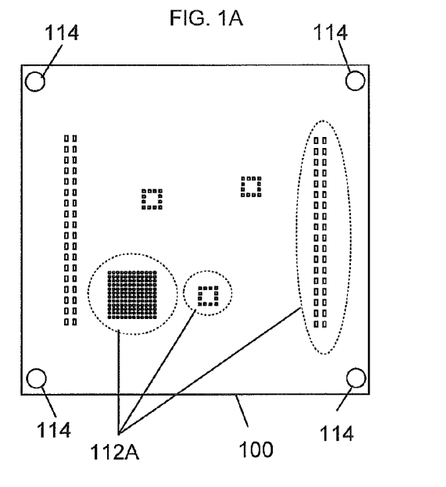
FIG. 1A depicts a top view of a substrate.
Figure 1B:
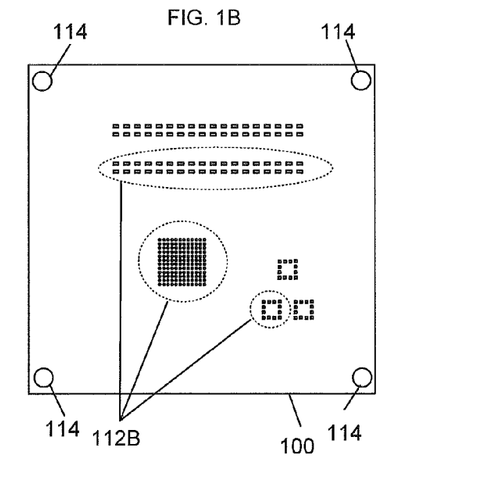
FIG. 1B depicts a bottom view of the substrate of FIG. 1A.
Figure 1C:
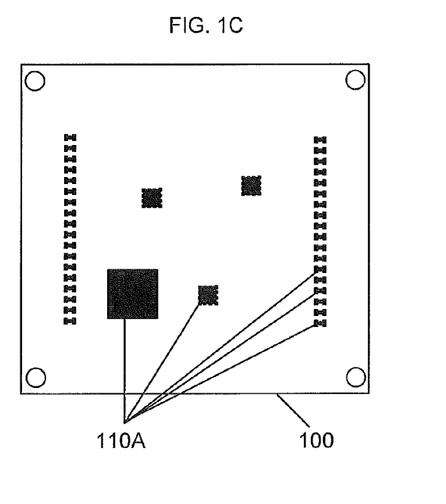
FIG. 1C depicts a top view of the substrate of FIG. 1A with components assembled thereon.
Figure 1D:
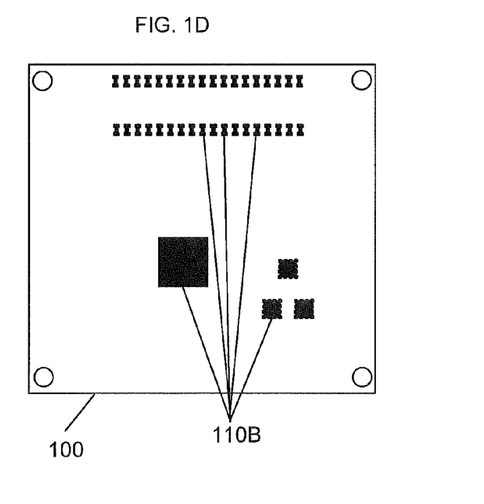
FIG. 1D depicts a bottom view of a substrate of FIG. 1B with components assembled thereon.
Figure 2A:
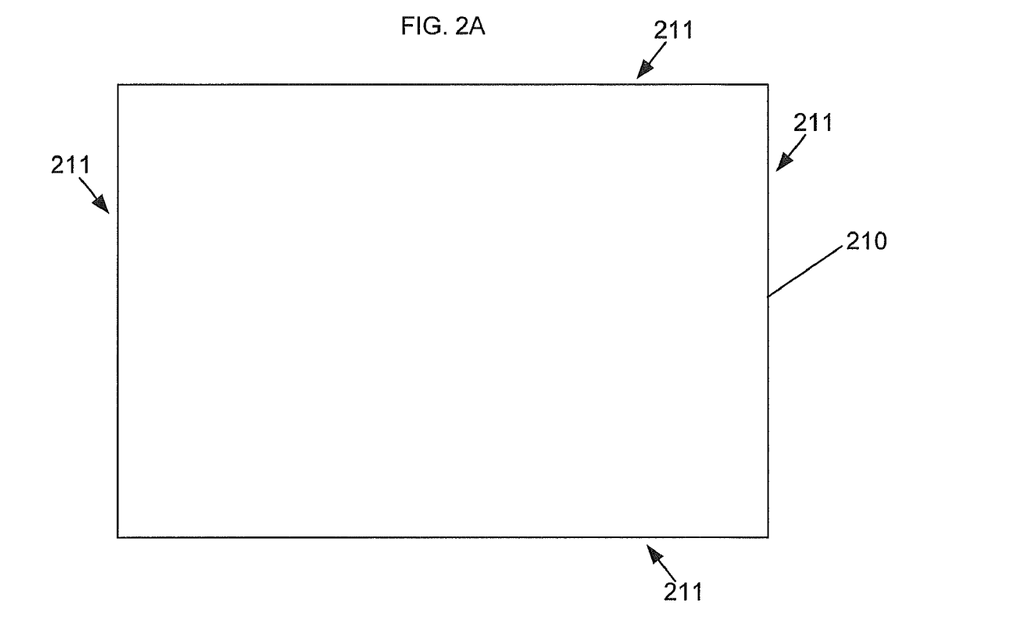
FIG. 2A depicts a top view of an embodiment of a substrate carrier system before being initially formed, in accordance with embodiments of the present invention.
Figure 2B:
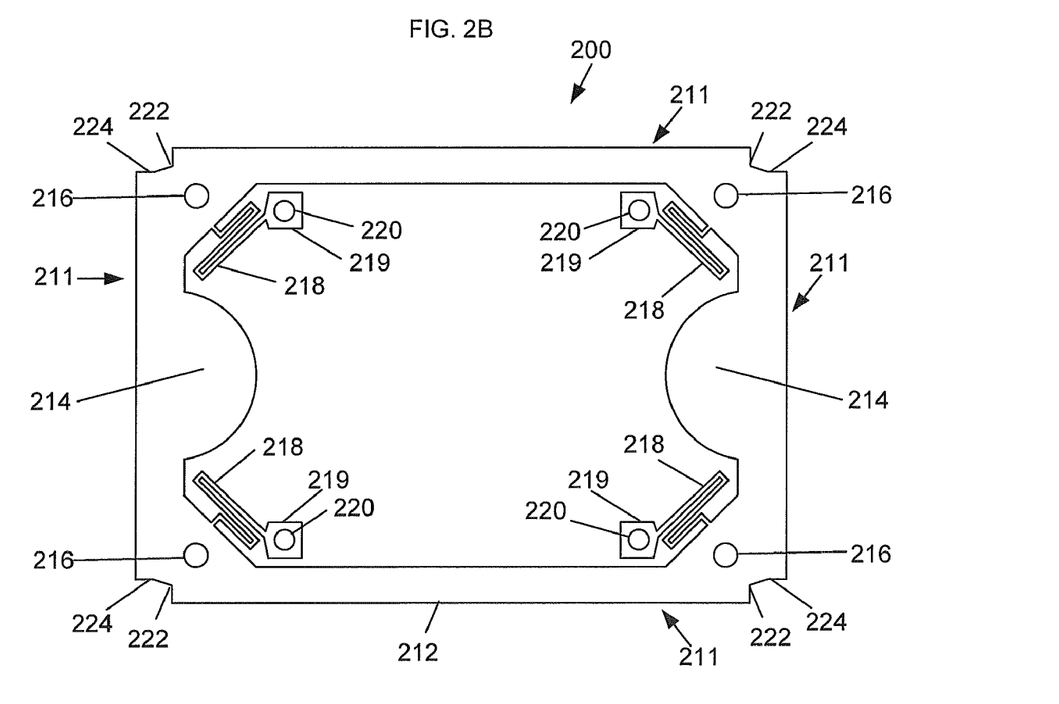
FIG. 2B depicts a top view of an embodiment of the substrate carrier system of FIG. 2A after being initially formed, in accordance with embodiments of the present invention.

Turning now to the drawings, FIGS. 2A-2B depict top views of an embodiment of a substrate carrier system 200, shown at different stages of formation. As depicted in FIG. 2A, the substrate carrier system 200 may be formed from thin metal stock 210 or other thin, thermally stable material with similar physical characteristics to the metal. The stock 210 may be cut, etched, or otherwise manipulated to initially form a frame 212, suction pad lands 214, registration holes 216, suspension arms 218 that extend from the frame 212, and suspension arm lands 219. Suspension arm lands 219 provide an area onto which the substrate, such as substrate 100, may be mounted. Additionally, suspension arm lands 219 may further comprise registration holes or alternative perforations 220. Also, folding points 222, 224 may be formed into the carrier system 200. Tooling holes or other positioning features may also be provided in gussets of the outer frame 212 to allow for registration of the frame 212 and a corresponding substrate, such as substrate 100. Furthermore, as an alternative means of substrate registration, when it may be impractical to use fiducials in conjunction with a machine vision system, it is also possible to laser mark fiducials or directional indicators, for the benefit of an operator, on the large lands 214 or other consistent locations on the outer frame 212 of the carrier 200. The carrier system 200 may include features facilitating quick and efficient registration with embodiments of a substrate 100.

Figure 3A:
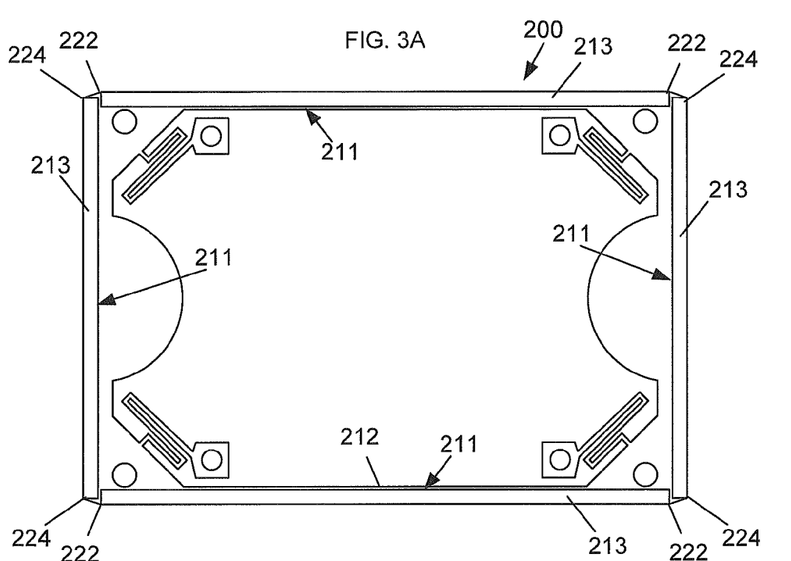
FIG. 3A depicts a top view of an embodiment of a substrate carrier system of FIG. 2A with the outer edges structurally manipulated to strengthen the frame, in accordance with embodiments of the present invention.
Figure 3B:
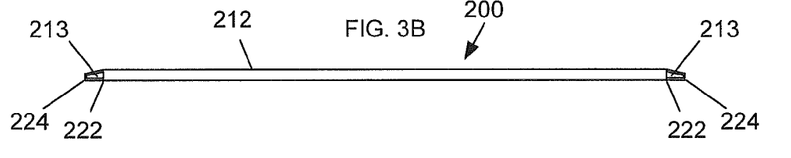
FIG. 3B depicts a side view of an embodiment of the substrate carrier system of FIG. 3A.
Figure 3C:
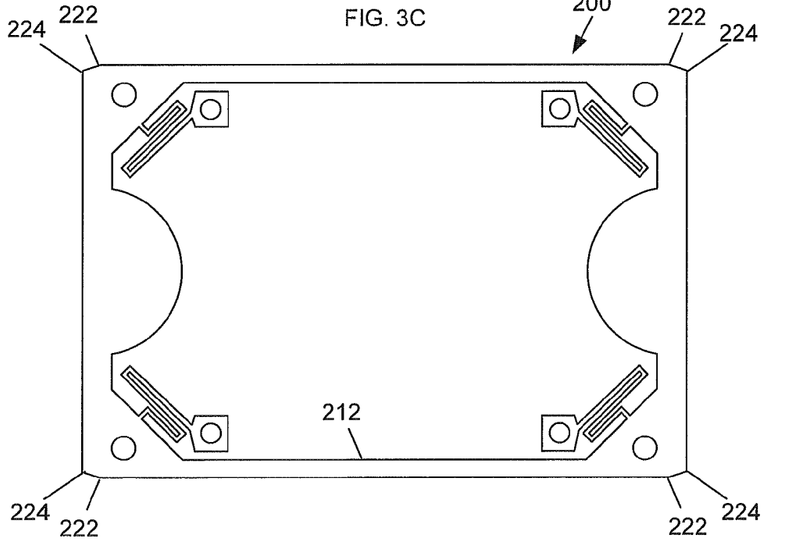
FIG. 3C depicts a bottom view of an embodiment of the substrate carrier system of FIG. 3A.
Figure 4A:
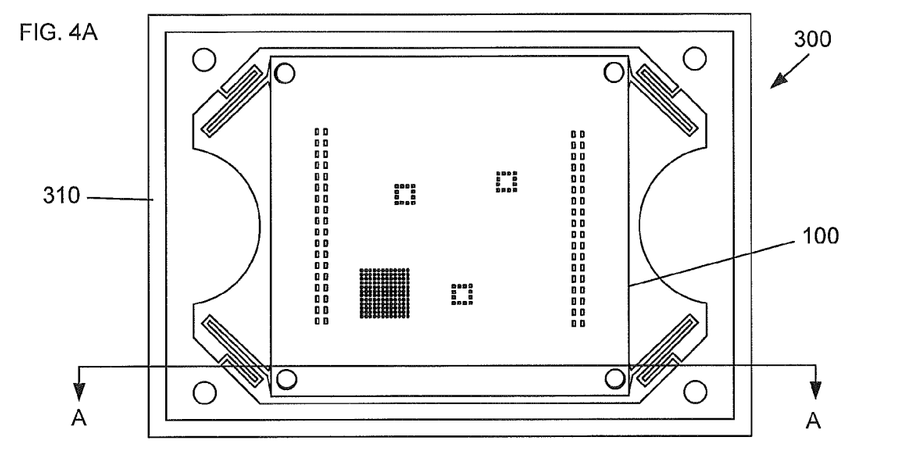
FIG. 4A depicts a top view of another embodiment of a substrate carrier system with a substrate mounted thereon, in accordance with embodiments of the present invention.
Figure 4B:
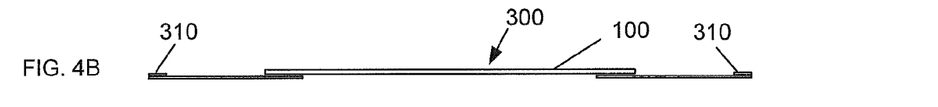
FIG. 4B depicts a cross section view taken along line A-A of FIG. 4A, in accordance with embodiments of the present invention.
Figure 4C:
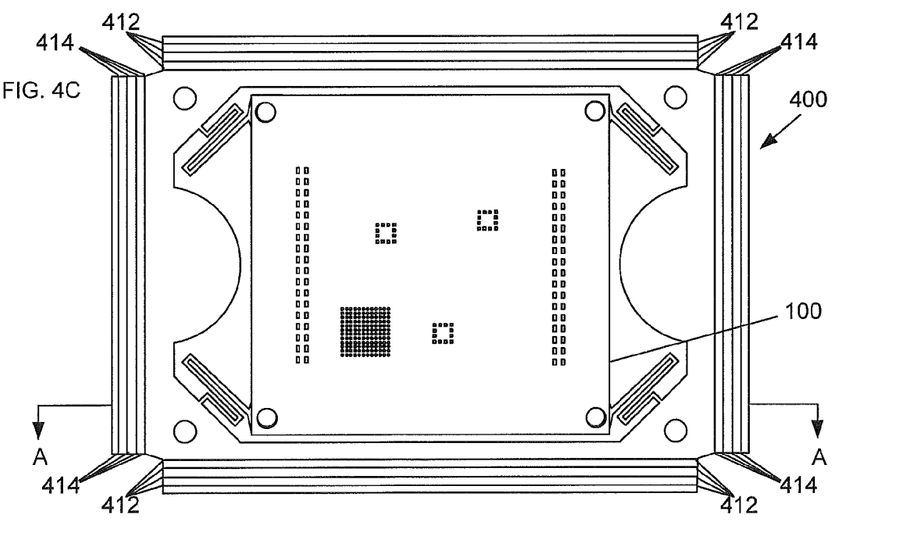
FIG. 4C depicts a top view of still another embodiment of a substrate carrier system with a substrate mounted thereon, in accordance with embodiments of the present invention.
Figure 4D:
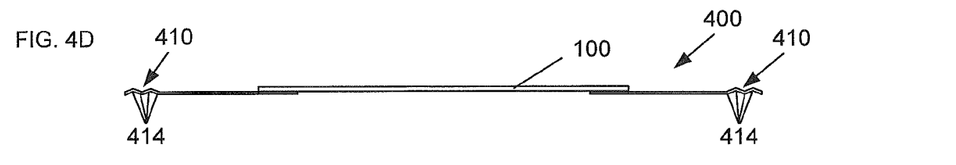
FIG. 4D depicts a cross section view taken along line A-A of FIG. 4C, in accordance with embodiments of the present invention.

FIGS. 3A-3C depict top, side, and bottom views of the embodiment of the substrate carrier system 200. As shown in FIG. 3A, the outer edges 211 of the frame 212 may be structurally manipulated to strengthen the frame 212. For example, the outer edges 211 may be folded along folding points 222, 224 to in order to stiffen as well as provide additional thickness to the outside perimeter of carrier system 200. The outer suspension frame 212 may include formed edge channels 213. The channels 213 may be formed by folding the edges 211 of the frame 212, such as along specific fold lines created between folding points 222, 224 to form edge channels 213. The edge channels 213 may provide strength to the frame 212 and the afford ability for the frame 212 to more effectively retain planarity. The edge channels 213 may be of sufficient thickness to lend strength to the frame 212, but also may be thin enough so as to not interfere with the operation of various assembly techniques. The edge channels 213 may provide sufficient thickness and strength to allow for adequate clamping force so as to not permanently deform edge channels 213 during the various assembly techniques. The additional thickness of the outside perimeter of the frame 212 may aid in the transport of substrate carrier system 200 using traditional assembly transfer systems. Alternatively to provide the similar stiffening and thickening means, as shown in FIGS. 4A-4B, a flexible substrate carrier system 300 may include an additional section 310 or sections (not shown) of thin stock metal or other material being positioned along the outer edge of the carrier system 300 to structurally manipulate and strengthen the carrier system 300. Furthermore, as shown in FIGS. 4C-4D, a substrate carrier system 400 may include pleats 410 added to the outer edges. Pleats 410 are formed at folding points 412, 414. The pleats 410, like the folded edge channels 213 or like the additional sections 310, help to add strength to the carrier system 400.

Figure 5A:
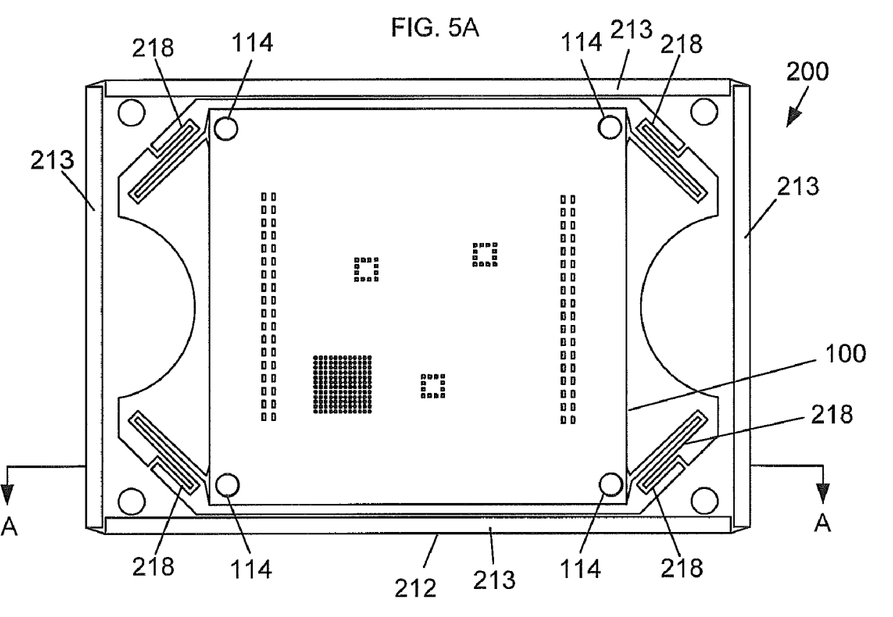
FIG. 5A depicts a top view of embodiment of the substrate carrier system of FIG. 3A with a substrate mounted thereon, in accordance with embodiments of the present invention.
Figure 5B:
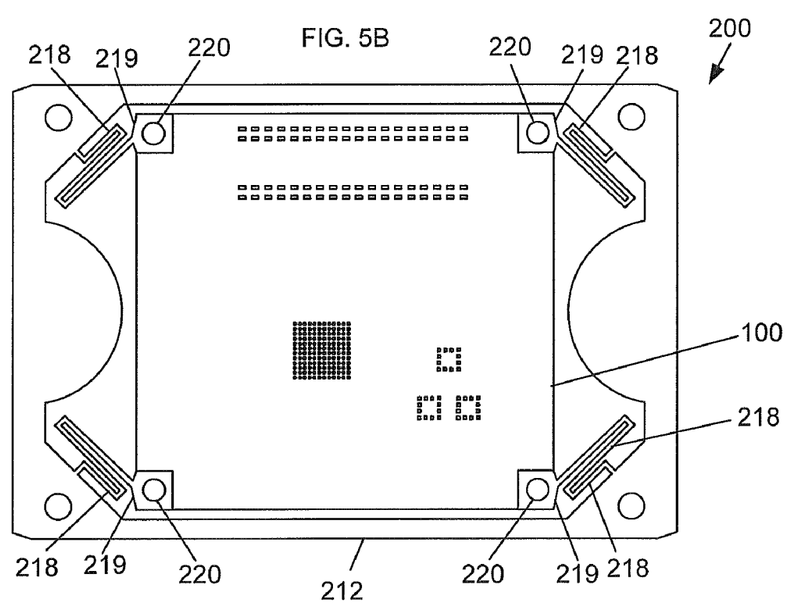
FIG. 5B depicts a bottom view of an embodiment of the substrate carrier system of FIG. 5A.

FIGS. 5A-5B depict top and bottom views of the embodiment the substrate carrier system 200 with substrate 100 mounted thereon. As depicted, the registration holes 114 of substrate 100 are aligned to registration holes or perforations 220 of suspension arm lands 219 when the substrate 100 is placed onto carrier system 200. In addition, perforations 220 in the suspension arm lands 219 may aid in the application of a laminating adhesive. The lands 219 may provide sufficient area for proper adhesion of the substrate 100 to the carrier 200; the perforations 220 make it easier for the adhesive to evenly wick between suspension arm lands 219 and substrate 100. Substrate 100 may be adhered to carrier system 200 with adhesive, liquid, film, or carrier-borne, or other epoxy suitable means. Moreover, the substrate 100 may be attached to the carrier 200 by means of thermally and chemically tolerant adhesive. The adhesive used to laminate the carrier suspension arm 218 lands 219 to the substrate 100 may resist pulling away or delaminating during possible repeated thermal excursions during various assembly techniques. It is desirable that the adhesive not adversely impact the substrate material set nor be impacted by common cleaning solvents. The adhesive may evenly distribute itself between substrate and carrier components by capillary action. In addition, the adhesive may also accommodate snap curing to facilitate an economy of lamination process time.

Referring further to FIGS. 5A-5B, an embodiment of a carrier system 200 may include lands 219 coupled with and located at the distal ends of four independent suspension arms 218, extending from four corner gussets of the outer suspension frame 212 of the carrier 200. The lands 219 may be laminated to the furthest extents (corners) of the substrate 100 and may provide structural support to the substrate 100 once mounted therewith. Although the suspension arms 218 and associated lands 219 are shown originating from the corners of the frame 100, those in the art should recognize that changes in the location of the lands 219 and suspension arms 218 may be provided anywhere within the carrier system 200 allowing for operable mounting of the substrate 100.

Figure 6A:
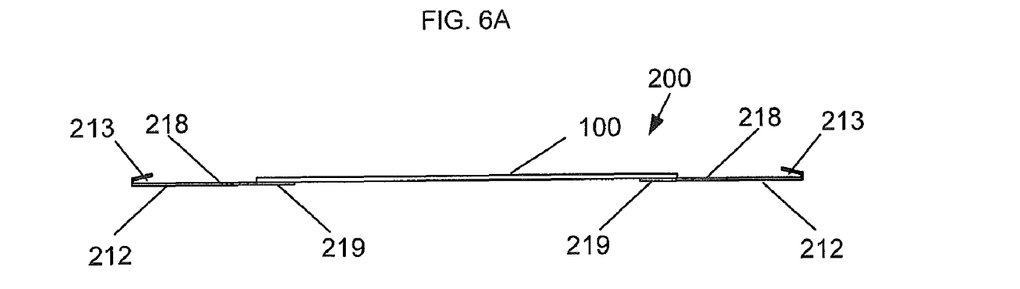
FIG. 6A depicts a cross section view taken along line A-A of FIG. 5A, in accordance with embodiments of the present invention.

FIG. 6A depicts a cross section view taken along line A-A of FIG. 5A, showing the substrate 100 sitting at the distal ends of suspension arms 218 on suspension arm lands 219. Suspension arm 218 design may be provided in consideration of how to efficiently permit low-force in-plane expansion and contraction of the substrate 100 that may occur during possible heating and cooling cycles of various assembly techniques. Furthermore, design of suspension arms 218 may also be provided in consideration of potential low-force vertical translation that may be necessary in order to conduct assembly operations associated with the mounted substrate 100. As depicted, suspension arms 218 may comprise a slender length of material extending to a distal end, whereon a land 219 has been positioned. The slender nature of the arms 218 allows the arms to bend. Suspension arms 218 allow for vertical translation of the board without significant stretching of the attached substrate 100. Operation of a suspension arm 218 may help to alleviate bending stresses that might otherwise cause the board to warp or bow during translation or assembly. The suspension arms 218 also may permit a wide range of thickness of substrates to be operable with carrier system embodiments, conceivably from zero to 0.30" thick, without significant variation in the design and configuration of the carrier system. The relatively thin configuration of carrier system embodiments, such as carrier system 200, may be of importance because it can permit screen printing operations, in addition to other assembly techniques, on both sides of the substrate 100 while it is mounted to the carrier 200. For example, embodiments of a carrier 200 (including when the carrier 200 includes strengthened and structurally modified outer edges 211) may be thinner than 0.005".

Figure 6B:
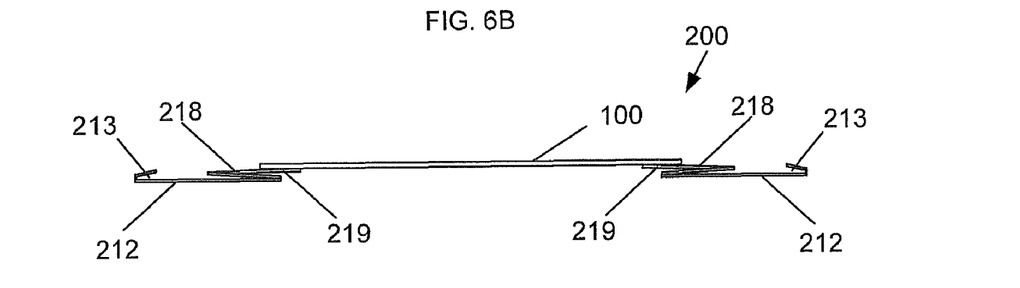
FIG. 6B depicts a cross section view of an embodiment of a substrate carrier system of FIG. 6A with the substrate in a vertically translated position, in accordance with embodiments of the present invention.
Figure 6C:
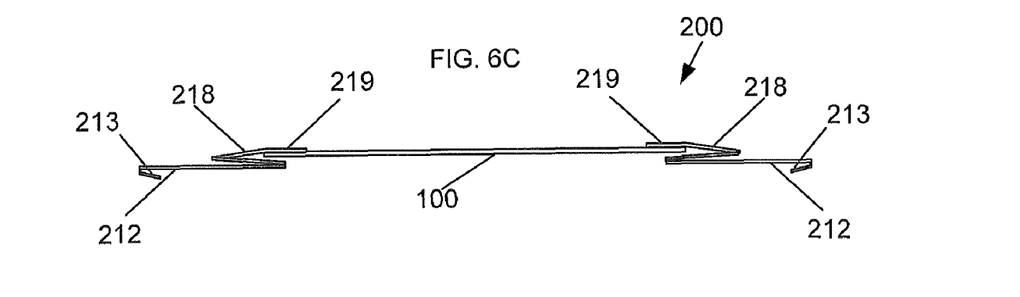
FIG. 6C depicts a cross section view of an embodiment of a substrate carrier system of FIG. 6A with the substrate carrier in a flipped position and with the substrate in a vertically translated position, in accordance with embodiments of the present invention.

FIGS. 6B and 6C depict how substrate 100 may be tensioned, by a device (not shown) such as a mandrel or support pedestal, which may be integrated as part of other resident assembly tooling, during an assembly technique. As the supporting device is raised, suspension arms 218 dynamically move and respond as with a spring force allowing substrate 100 to be vertically translated and flattened across the device (mandrel, support pedestal, block), thereby improving the surface area planarity of substrate 100 upon which the assembly technique must be performed.

Those in the art will recognize that carrier system embodiments need not be connected to a support pedestal or mandrel. Divorcing the carrier, such as carrier 200, from a substrate support pedestal can result in a more 'universal' carrier system to work across multiple product types relying upon one dedicated tooling set for each product, rather than a necessity of dedicating volumes of fixtures to correspond with and accommodate unique clearances and tolerances for each particular product type. The thermal and real mass of the carrier system is also significantly less than a carrier system having an integrated board support pedestal. Carrier system configurations may be designed to facilitate a vacuum being pulled to ensure planarity and sufficient contact between the carrier and a possible support pedestal and to permit more accurate assembly operation on the substrate.

Figure 7A:
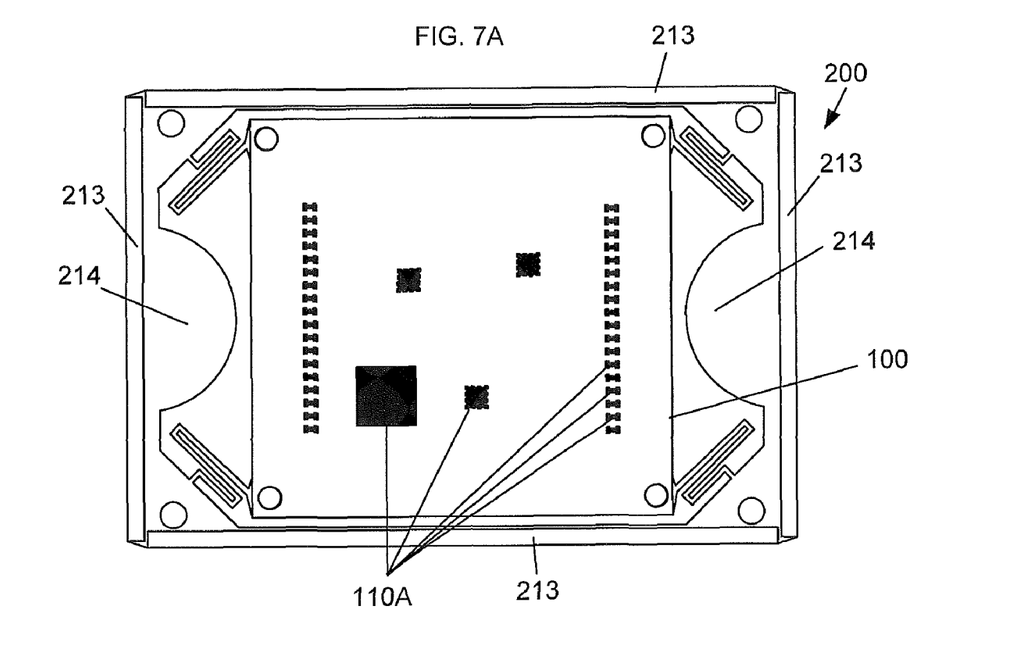
FIG. 7A depicts a top view of an embodiment of a substrate carrier system of FIG. 5A with components assembled thereon, in accordance with embodiments of the present invention.
Figure 7B:
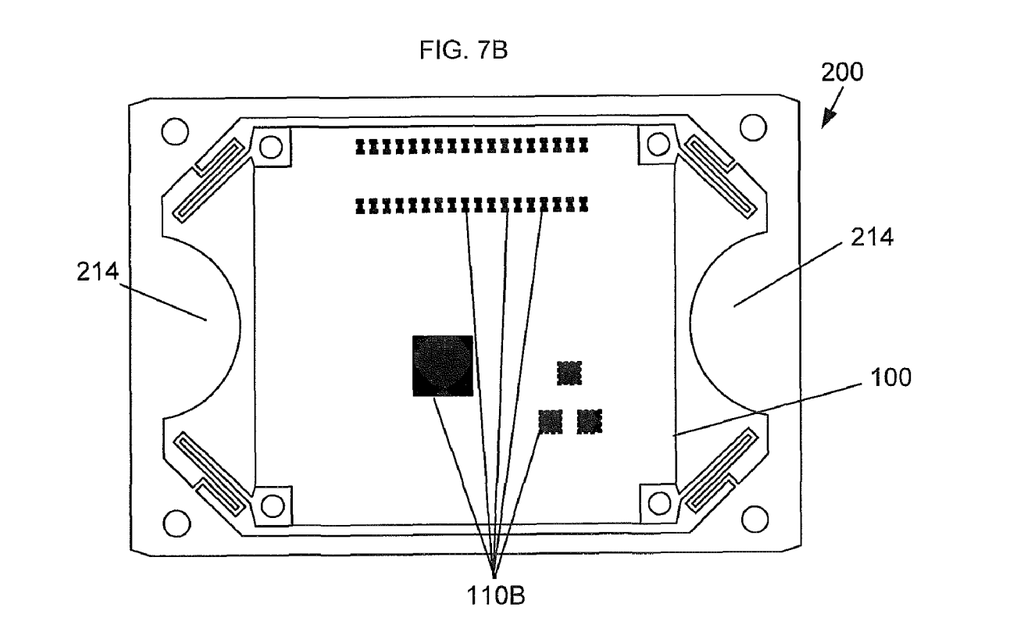
FIG. 7B depicts a bottom view of an embodiment of the substrate carrier system of FIG. 7A.

FIGS. 7A-7B depict top and bottom views of the embodiment of the substrate carrier system 200 with substrate 100 mounted thereon after a completed assembly technique. In this example, the components 110A, 110B have been placed on substrate 100. As depicted, relatively large suction cup lands 214 are located on each of end of the carrier 200. These lands 214 stiffen the outer carrier frame 212, provide an additional means of sensing the leading edge of the carrier 200 with photosensors or the like, and allow for the carrier 200 to be transported by means of suction cups during an assembly technique.

Figure 8A:
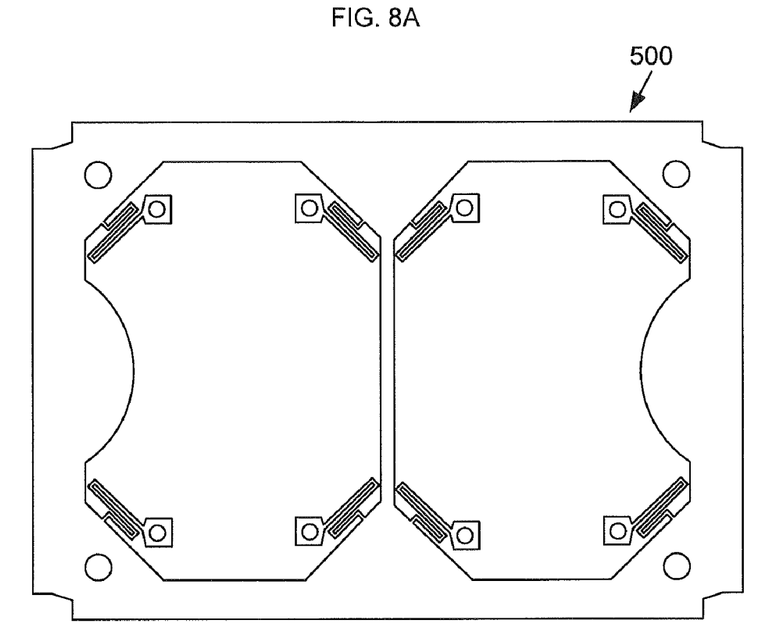
FIG. 8A depicts a top view of an alternate embodiment of a substrate carrier system of FIG. 3A being structurally configured to mount multiple substrates thereon, in accordance with embodiments of the present invention.
Figure 8B:
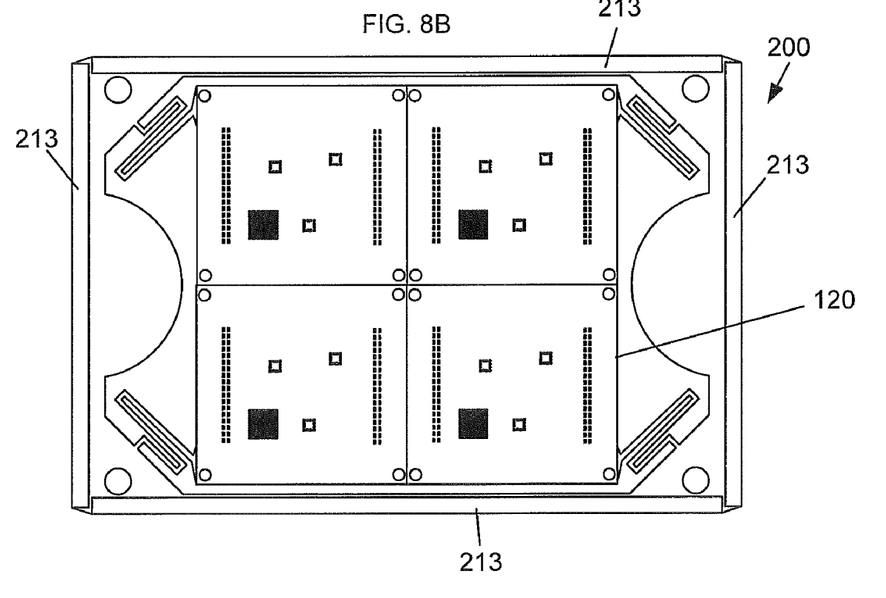
FIG. 8B depicts a top view of an alternate embodiment of a substrate carrier system of FIG. 3A being structurally configured to mount a multi-panel substrate thereon, in accordance with embodiments of the present invention.

FIGS. 8A-8B depict alternate embodiments of substrate carrier system 200. As shown in FIG. 8A, substrate carrier system 500 may be adapted to mount multiple substrates 100. As shown in FIG. 8B, substrate carrier system 200 may be configured to have a multiple panel substrate 120 mounted thereon.

Various substrate handling advantages are achieved through use of embodiments of substrate carrier systems 200. For instance, substrate carrier system 200 provides the ability to support single image circuit boards or a panel of multiple image circuit boards during a variety of assembly techniques on both sides of the board(s) without dismounting or changing carrier systems. Additionally, a substrate carrier system 200 permits easy yet precisely controlled post-mounting tensioning of substrates 100 mounted on to carrier system 200. The substrate tensioning process through use of suspension arms 218 is relatively simple; lamination, exotic alloy frames, disposable components, and complex operations are not needed for tensioning. Furthermore, the embodiments of the substrate carrier system 200 may be completely mechanical so that no pneumatic actuation is required. The technology embodied in a substrate carrier system 200 has been found to aid in the reproducible and reversible tensioning of substrates 100, such as a polyimide or other film, to ensure planarity before, during, and after processing. Moreover, undesirable defects, such as wrinkles or other non-planar conditions introduced as a result of fabrication, mounting, or other handling operations and not resulting from excessive material addition or subtraction during standard fabrication and assembly processes, may be removed via use of embodiments of a substrate carrier system 200 to allow for accurate registration of the substrate 100 for patterning, printing, placement, reflow, deposition, or any other standard assembly technique requiring precise registration and/or use of a vision system. The structurally manipulated edges of a frame 212 of a carrier system 200 may render the frame strong enough to provide operable transfer of the carrier system 200 through a board handling system during an assembly process.

Embodiments of a carrier system, such as carrier systems 200, 300, 400, 500, facilitate assembly techniques (work done) on both sides of a substrate, such as substrate 100, without the need to dismount or change carriers. For example, carrier systems 200, 300, 400, 500 may facilitate, among other things: screen or stencil printing; component placement on a substrate by various placement machines, such as overhead gantry or turret-style pick and place machines; convective mass reflow; material dispensing; and/or any cleaning operations that may be done on either side of the substrate 100. Some embodiments may permit a substrate 100 to be mounted to a carrier system 200, 300, 400, 500 through both electrical testing and burn in processes. Furthermore, carrier system 200, 300, 400, 500 components and fixtures may work with known and typical production equipment sets. In addition carrier systems 200, 300, 400, 500 may be disposable and cost effective due to fairly simple high volume manufacture thereof in conjunction with the carrier system embodiment's universality in being able to facilitate various assembly techniques on both sides of a substrate.

One other structural and functional feature may correspond to the possible finishes of the substrate carrier system 200 as being non-reflective except for one or more corners of the carrier system 200. This embodied non-reflective design may be provided so that as the carrier system 200 is transported through a handling system, the system may detect the presence and/or passage of the carrier system 200 by using means such as a reflective sensor or infrared sensor. The reflective sensor may comprise a light emitter and a light sensor. When the reflective sensor emits light from the light emitter and the carrier system 200 passes by the reflective sensor, the emitted light may reflect off of the reflective corner of the carrier system 200 back to the light sensor of the reflective sensor thereby detecting the presence and/or passage of the carrier system 200. The component features of carrier systems 200, 300, 400, 500 may be designed for functionality within typical ranges of operability with regard to known devices facilitating assembly techniques. For instance, if extraordinary forces were applied to the carrier frame 212, non-operable reactions, such as incidental warpage that may be caused by an excessive of off-axis clamping force, may be taken up by the suspension arms 218, leaving the position of the substrate 100 relatively undisturbed.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention.

What is claimed is:

1. A method of supporting a substrate during an assembly process, the method comprising:
   providing a substrate carrier system including:
      a frame having an outer edge, wherein the outer edge is structurally manipulated to strengthen the frame; and
      at least two suspension arms extending from the frame for holding the substrate, wherein the suspension arms allow the substrate to be vertically translated relative to the frame;
      wherein the frame and the suspension arms are formed from a same piece of material;
   mounting the substrate to the carrier system; and
   performing an assembly process on the substrate while the substrate is mounted to the carrier system.

2. The method of supporting a substrate of claim 1, further comprising disposing of the substrate carrier system after the assembly process has been performed.

3. The method of supporting a substrate of claim 1, wherein the assembly process is performed by a board handling system and the frame is strong enough to provide operable transfer through the board handling system during the assembly process.

4. The method of supporting a substrate of claim 1, wherein the substrate carrier system facilitates the ability perform assembly techniques on both sides of the board(s) without dismounting or changing the carrier system.

5. The method of supporting a substrate of claim 1, wherein the substrate carrier system permits easy yet precisely controlled post-mounting tensioning of a substrate mounted on to carrier system, tensioning facilitated through use of the suspension arms.

6. The method of supporting a substrate of claim 1, wherein the carrier system is transported by means of suction cups vacuum attaching to land areas of the frame of the carrier system during performance of an assembly process.

7. The method of supporting a substrate of claim 1, wherein the substrate is mounted to the carrier system by an adhesive distributed between the substrate and lands located at the distal ends of the suspension arms.

* * * * *